United States Patent
Chen et al.

(10) Patent No.: US 9,443,841 B2
(45) Date of Patent: Sep. 13, 2016

(54) ELECTROSTATIC DISCHARGE PROTECTION STRUCTURE CAPABLE OF PREVENTING LATCH-UP ISSUE CAUSED BY UNEXPECTED NOISE

(71) Applicant: UNITED MICROELECTRONICS CORP., Hsin-Chu (TW)

(72) Inventors: Lu-An Chen, Hsinchou County (TW); Ya-Ting Lin, Yunlin County (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/986,741

(22) Filed: Jan. 4, 2016

(65) Prior Publication Data
US 2016/0118374 A1    Apr. 28, 2016

Related U.S. Application Data

(62) Division of application No. 14/177,228, filed on Feb. 11, 2014, now Pat. No. 9,263,562.

(51) Int. Cl.
| | |
|---|---|
| H01L 23/62 | (2006.01) |
| H01L 27/02 | (2006.01) |
| H01L 29/74 | (2006.01) |
| H01L 29/08 | (2006.01) |
| H01L 29/06 | (2006.01) |
| H01L 29/87 | (2006.01) |
| H01L 29/40 | (2006.01) |

(52) U.S. Cl.
CPC ....... *H01L 27/0262* (2013.01); *H01L 29/0649* (2013.01); *H01L 29/0804* (2013.01); *H01L 29/0821* (2013.01); *H01L 29/7432* (2013.01); *H01L 29/87* (2013.01); *H01L 29/402* (2013.01)

(58) Field of Classification Search
CPC .......... H01L 27/0255; H01L 27/0266; H01L 27/027; H01L 27/0274; H01L 27/02787
See application file for complete search history.

(56) References Cited

U.S. PATENT DOCUMENTS

| | | | |
|---|---|---|---|
| 5,060,037 A | 10/1991 | Rountree | |
| 7,202,114 B2 | 4/2007 | Salcedo | |
| 2007/0007545 A1 | 1/2007 | Salcedo | |
| 2013/0153957 A1* | 6/2013 | Lin | ...... H01L 29/861 257/147 |

OTHER PUBLICATIONS

Chen, Title of Invention: Electrostatic Discharge Protection Structure and Electrostatic Discharge Protection Circuit, U.S. Appl. No. 13/940,081, filed Jul. 11, 2013.

* cited by examiner

Primary Examiner — Hoai V Pham
(74) Attorney, Agent, or Firm — Winston Hsu; Scott Margo

(57) ABSTRACT

An electrostatic discharge protection structure comprises an isolation layer, a high voltage P-well, an N-well, a P-well, a first doped region of N-type conductivity, a second doped region of P-type conductivity, a third doped region of N-type conductivity, a fourth doped region of P-type conductivity, an anode, and a cathode. The isolation layer is disposed on a substrate. The high voltage P-well is disposed on the isolation layer. The N-well is disposed in the high voltage P-well. The P-well is disposed in the high voltage P-well, and the P-well is separated from the N-well. The first and the second doped regions are disposed in the N-well. The third and the fourth doped regions are disposed in the P-well. The anode is electrically connected to the first doped region and the second doped region, and the cathode is electrically connected to the fourth doped region.

17 Claims, 6 Drawing Sheets

ELECTROSTATIC DISCHARGE PROTECTION STRUCTURE CAPABLE OF PREVENTING LATCH-UP ISSUE CAUSED BY UNEXPECTED NOISE

CROSS REFERENCE TO RELATED APPLICATIONS

This application is a division of U.S. application Ser. No. 14/177,228, which was filed on Feb. 11, 2014 and is entitled "ELECTROSTATIC DISCHARGE PROTECTION STRUCTURE CAPABLE OF PREVENTING LATCH-UP ISSUE CAUSED BY UNEXPECTED NOISE", and is included herein by reference.

BACKGROUND OF THE INVENTION

1. Field of the Invention

The invention relates to an electrostatic discharge protection structure, and more particularly, to an electrostatic discharge protection structure capable of preventing the latch-up issue caused by unexpected noise.

2. Description of the Prior Art

Electrostatic discharge (ESD) is an effect of electric charges moving rapidly between two electrically charged objects through a discharge path in a short period of time caused by contacting or short circuiting. Electrostatic discharge can damage components of an integrated circuit. Since the human body, machines used to package integrated circuits, and instruments for testing integrated circuits are all common charged bodies, the static electric charges of a charged body may discharge to a chip and cause irreversible harm to the chip once the charged body contacts with the chip. Therefore, an electrostatic discharge protection device is designed to provide a discharge path and to protect the integrated circuit from being blown out by an instantaneous discharge current.

In addition to the electrostatic clamp, which is a known electrostatic discharge protection apparatus, silicon controlled rectifier (SCR) is another popular electrostatic discharge protection apparatus. When an SCR is triggered by a triggering voltage, it will go into a snapback breakdown condition. Once the SCR enters the snapback breakdown condition, the SCR will become a low resistance path and clamp the holding voltage in a lower level. The low resistance path can provide a discharge path when the electrostatic discharge occurs so the discharge current will not flow through the integrated circuit and damage the chip.

However, the holding voltage is found to be much smaller than the power supply voltage for high-voltage devices. Such characteristics will cause the IC to be susceptible to the latch-up danger in practical system applications.

SUMMARY OF THE INVENTION

One embodiment of the present invention discloses an electrostatic discharge protection structure. The electrostatic discharge protection structure includes a first well, a second well disposed in the first well, a first and a second doped region disposed in the first well, a third and a fourth doped region disposed in the second well, a first electrode electrically connected to the first doped region and the second doped region, and a second electrode electrically connected to the fourth doped region.

Another embodiment of the present invention discloses an electrostatic discharge protection structure. The electrostatic discharge protection structure includes an isolation layer, a high voltage P-well disposed on the isolation layer, an N-well disposed in the high voltage P-well, a P-well disposed in the high voltage P-well, a first doped region of N-type conductivity disposed in the N-well, a second doped region of P-type conductivity disposed in the N-well, a third doped region of N-type conductivity disposed in the P-well, a fourth doped region of P-type conductivity disposed in the P-well, an anode electrically connected to the first doped region and the second doped region, and a cathode electrically connected to the fourth doped region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
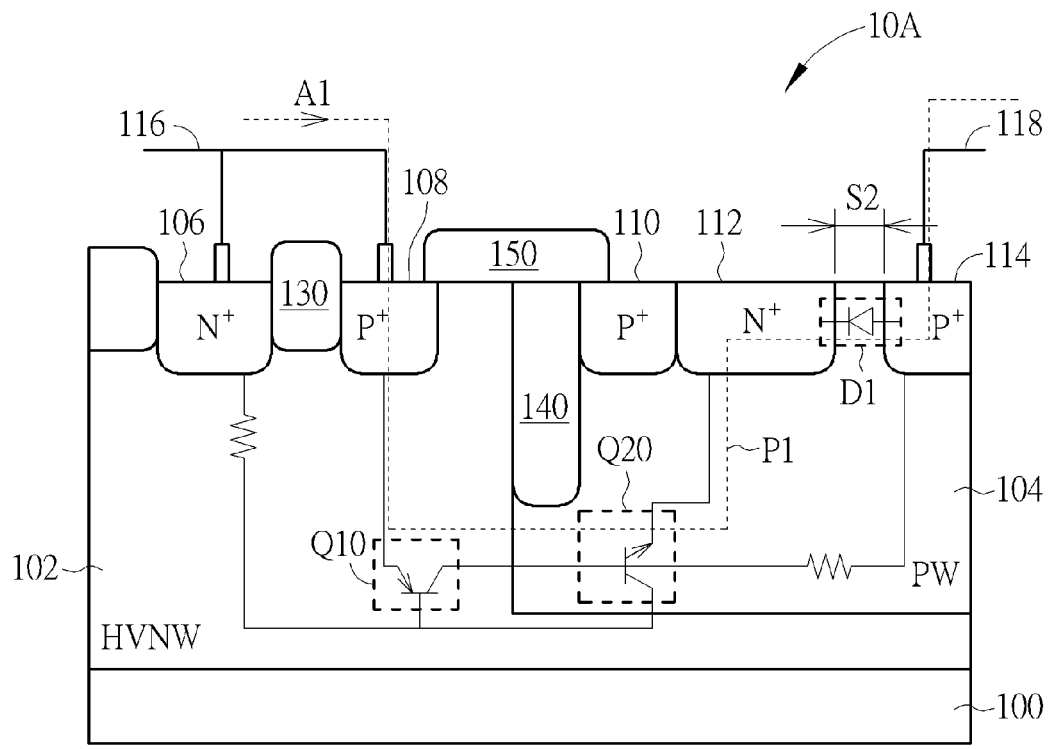
FIG. 1 shows an electrostatic discharge protection structure according to one embodiment of the present invention based on a high voltage filed-diffused SCR structure.

FIG. 1 shows an electrostatic discharge protection structure 10A according to an embodiment of the present invention based on a high voltage filed-diffused SCR structure. Referring to FIG. 1, an electrostatic discharge protection structure 10A is disposed on a substrate 100. The electrostatic discharge protection structure 10A includes a first well 102, a second well 104, a first doped region 106, a second doped region 108, a third doped region 112, a fourth doped region 114, a fifth doped region 110, a first electrode 116, and a second electrode 118. The first well 102, the first doped region 106 and the third doped region 112 are of a first conductivity type while the second well 104, the second doped region 108, the fourth doped region 114 and the fifth doped region 110 are of a second conductivity type. In the present embodiment, the first conductivity type is N-type and the second conductivity type is P-type. That is, the first doped region 106 and the third doped region 112 are N⁺ doped regions. The second doped region 108, the fourth doped region 114, and the fifth doped region 110 are P⁺ doped regions. The first well 102 is a high voltage N-well (HVNW), and the second well 104 is a P-well (PW). The first well 102 has a lower doping concentration than the second well 104. The first to fifth doped regions 106, 108, 112, 114 and 110 have a higher doping concentration than the second well 104. In one embodiment, the doping concentration of the first well 102 is $10^{15}$ to $10^{17}$ cm$^{-3}$. The doping concentration of the second well 104 is $10^{17}$ to $10^{19}$ cm$^{-3}$. The doping concentration of the first to fifth doped regions 106, 108, 112, 114 and 110 is $10^{19}$ to $10^{21}$ cm$^{-3}$.

The first well 102 is disposed on the substrate 100. The second well 104 is disposed in the first well 102. The first doped region 106 and the second doped region 108 are disposed in the first well 102. The third doped region 112, the fourth doped region 114 and the fifth doped region 110 are disposed in the second well 104. The third doped region 112 is disposed between the fifth doped region 110 and the fourth doped region 114. Furthermore, the depth of the second well 104 is smaller than the depth of the first well 102 and depths of the five doped regions 106, 108, 112, 114, and 110 are smaller than the depth of the second well 104. In one embodiment, the depth of the first well 102 is 0 µm to 10 µm. The depth of the second well 104 is 0 µm to 3 µm, and the depth of each of the five doped regions 106, 108, 112, 114, and 110 is 0 µm to 0.3 µm. The depth and concentration of each well or region can be adjusted based on specific requirement and consideration. They are not limited to the above ranges.

Figure 2:
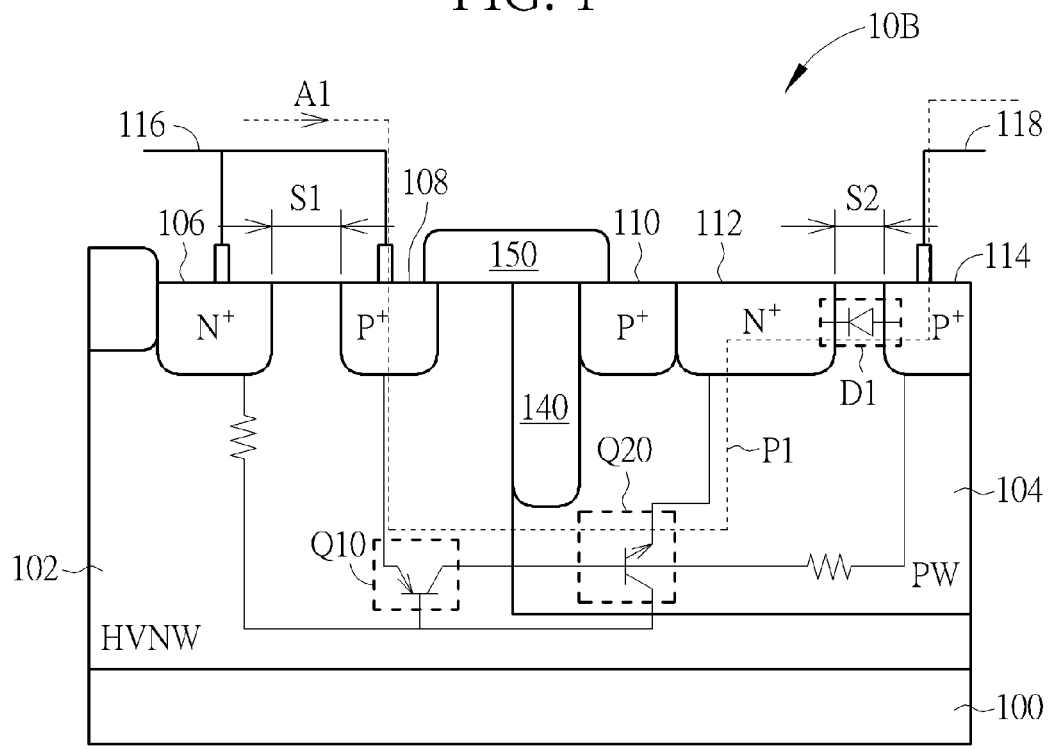
FIG. 2 shows an electrostatic discharge protection structure according to another embodiment of the present invention based on a high voltage filed-diffused SCR structure.
Figure 3:
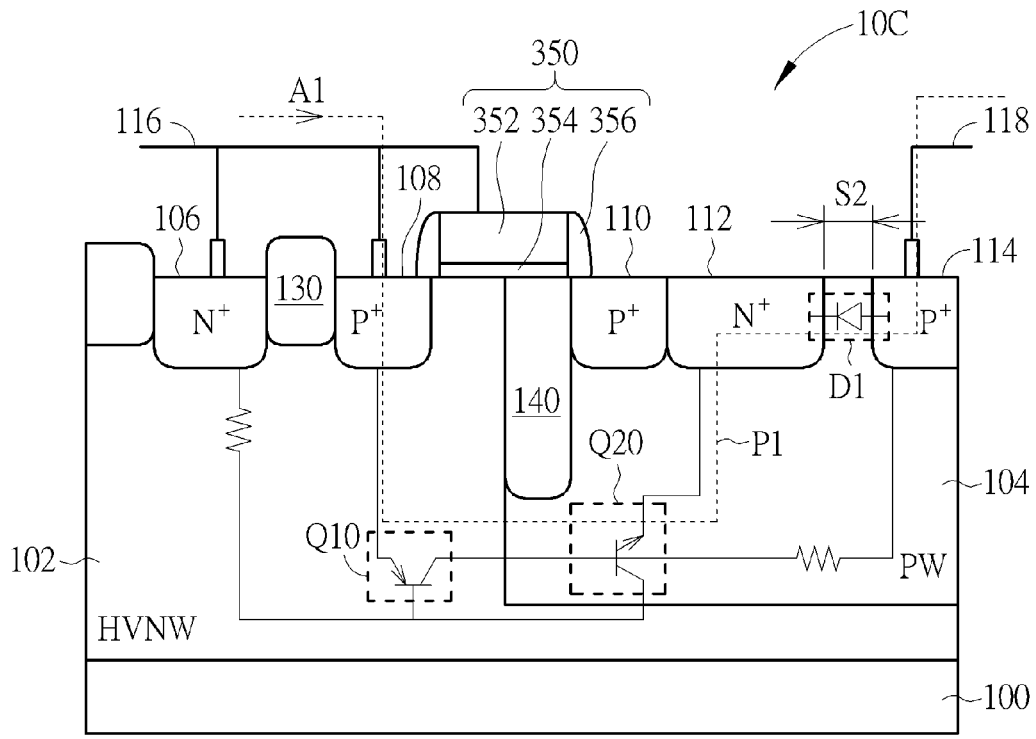
FIG. 3 shows an electrostatic discharge protection structure according to another embodiment of the present invention based on a high voltage filed-diffused SCR structure.
Figure 4:
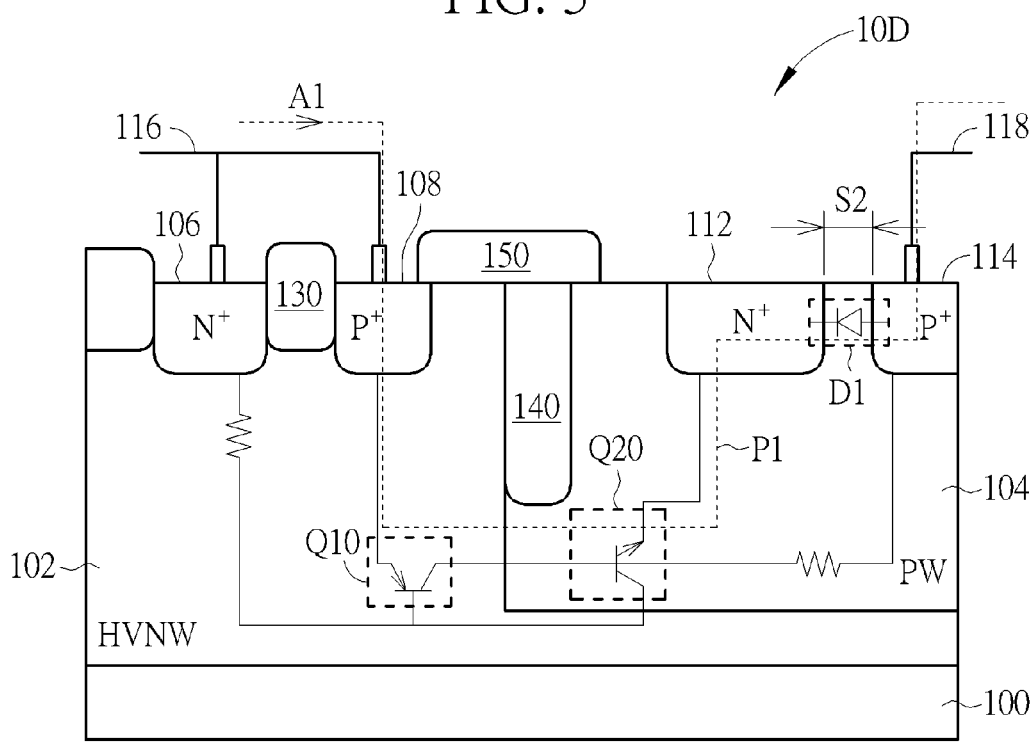
FIG. 4 shows an electrostatic discharge protection structure according to another embodiment of the present invention based on a high voltage filed-diffused SCR structure.

The first doped region 106 and the second doped region 108 can be separated by an isolation structure 130 as shown in FIG. 1. The isolation structure 130 can be a field oxide or a shallow trench isolation structure. However, referring to FIG. 2, FIG. 2 shows an electrostatic discharge protection structure 10B according to another embodiment of the present invention based on a high voltage filed-diffused SCR structure. The electrostatic discharge protection structure 10B has no isolation structure between the first doped region 106 and the second doped region 108. Instead the first doped region 106 and the second doped region 108 can be separated by a distance S1. The distance S1 can be between 0 µm and 2 µm. Referring to both FIGS. 1 and 2, an isolation structure 140 is disposed between the second doped region 108 and the third doped region 112 in the first well 102 or the second well 104. The isolation structure 140 can be a field oxide or a shallow trench isolation structure. Moreover, the electrostatic discharge protection structure 10A, 10B can further include an isolation structure 150 disposed between the second doped region 108 and the fifth doped region 112 above the first well 102 or the second well 104. In one embodiment, the isolation structure 150 can be a field oxide or a shallow trench isolation structure. Referring to FIG. 3, FIG. 3 shows an electrostatic discharge protection structure 10C according to another embodiment of this invention. Instead of including an isolation structure 150, the electrostatic discharge protection structure 10C includes a gate structure 350 between the second doped region 108 and the fifth doped region 110. The gate structure 350 is connected to the first electrode 116 and may include a gate 352, a gate dielectric layer 354, and a spacer 356. The material of the gate 352 can be a conductor such as metal or doped polysilicon. The material of the gate dielectric layer 354 can be an insulator such as silicon oxide or a high dielectric constant material. The material of the spacer 356 can be an insulator such as silicon oxide. The gate structure 350 is electrically connected to the first electrode 116. In addition, the fifth doped region 110 is an auxiliary selection and can be removed in other embodiment. Referring to FIG. 4, FIG. 4 shows an electrostatic discharge protection structure 10D. The electrostatic discharge protection structure 10D is different from the electrostatic discharge protection structure 10A only in that the electrostatic discharge protection structure 10D has total four doped regions 106, 108, 112, and 114. Furthermore, the isolation structure 150 or the gate structure 350 can be formed between the second doped region 108 and the third doped region 112.

The first electrode 116 is the anode of the electrostatic discharge protection structure 10A to 10D and the second electrode 118 is the cathode of the electrostatic discharge protection structure 10A to 10D. The first electrode 116 is electrically connected to the first doped region 106 and the second doped region 108. The second electrode 118 is electrically connected to the fourth doped region 114. Unlike the traditional SCR electrostatic discharge protection structure, the third doped region 112 is not electrically connected to the second electrode 118.

Referring to FIG. 1, a first bipolar junction transistor Q10 is formed by the second doped region 108, the first well 102, and the second well 104. In addition, a second bipolar junction transistor Q20 is formed by the first well 102, the second well 104 and the third doped region 112. In the embodiment of FIG. 1, a current A1 flows from the first electrode 116, the anode of the electrostatic discharge protection structure 10, to the second electrode 118, the cathode of the electrostatic discharge protection structure 10A through the second doped region 108, the first well 102, the second well 104, the third doped region 112, and the fourth doped region 114. Consequently, the path P1 of the current A1 contains a laminated structure of P⁺/HVNW/PW/N⁺/P⁺, forming an SCR.

In addition, the third doped region 112 and the fourth doped region 114 forms a reversed diode D1 on the path P1. Since the second electrode 118 is not connected to the third doped region 112, the current flows into the third doped region 112 must go through the fourth doped region 114 to reach the second electrode 118. Therefore, the discharge current has to overcome a breakdown voltage of the reversed diode D1. That is, the holding voltage $V_h$ of the electrostatic discharge protection structure 10A is increased by an amount of the breakdown voltage of the reversed diode D1, for instance, about 7-8V.

Moreover, when a distance S2 between the third doped region 112 and the fourth doped region 114 increases, the breakdown voltage of the reversed diode D1 also increases. Therefore, the holding voltage $V_h$ of the electrostatic discharge protection structure 10A can be adjusted by adjusting the distance S2 between the third doped region 112 and the fourth doped region 114. The distance S2 can be between 0 µm and 5 µm.

Figure 5:
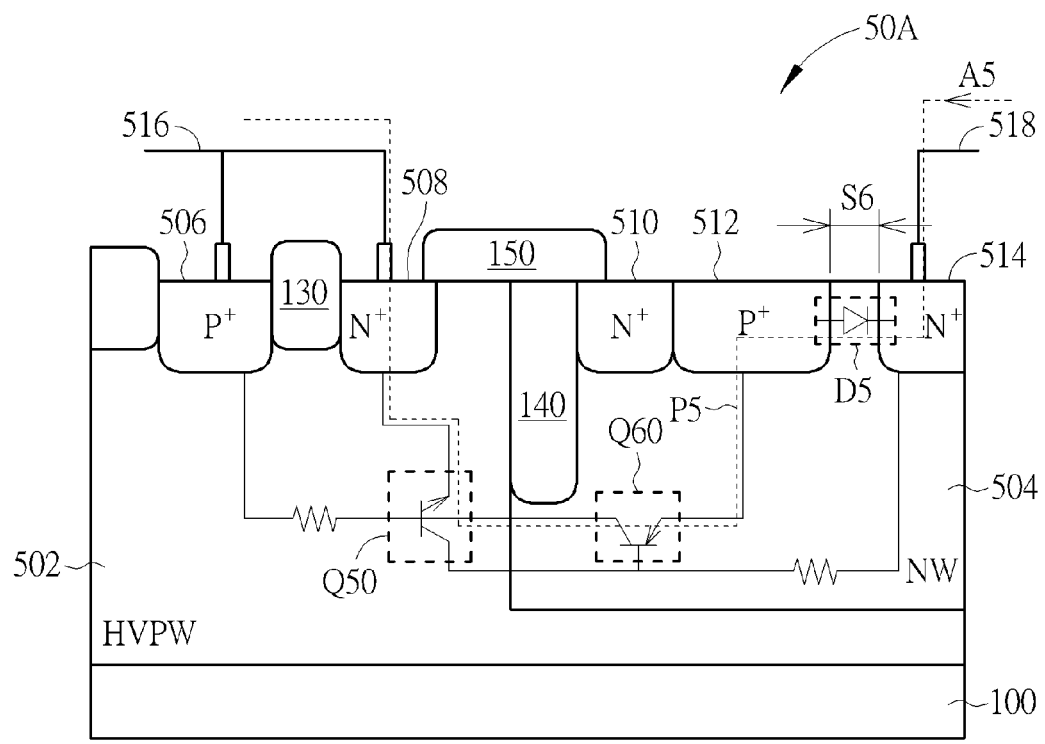
FIG. 5 shows an electrostatic discharge protection structure according to another embodiment of the present invention based on a high voltage filed-diffused SCR structure.

Referring to FIG. 5, FIG. 5 shows an electrostatic discharge protection structure 50A according to another embodiment of the present invention based on a high voltage filed-diffused SCR structure. The difference between the electrostatic discharge protection structure 50A in FIG. 5 and the electrostatic discharge protection structure 10A in FIG. 1 is in the first conductivity type, the second conductivity type and the positions of anode and cathode. The first conductivity type is P-type and the second conductivity type is N-type in the embodiment of FIG. 5. Thus the first doped region 506 and the third doped region 512 are P+ doped regions. The second doped region 508, the fourth doped region 514, and the fifth doped region 510 are N+ doped regions. The first well 502 is a high voltage P-well (HVPW), and the second well 504 is an N-well (NW). The first well 502 has a lower doping concentration than the second well 504. The first to fifth doped regions 506, 508, 512, 514, and 510 have a higher doping concentration than the second well 504. Except for the conductivity types, the electrostatic discharge protection structure 50A has a structure similar to the electrostatic discharge protection structure 10.

Figure 6:
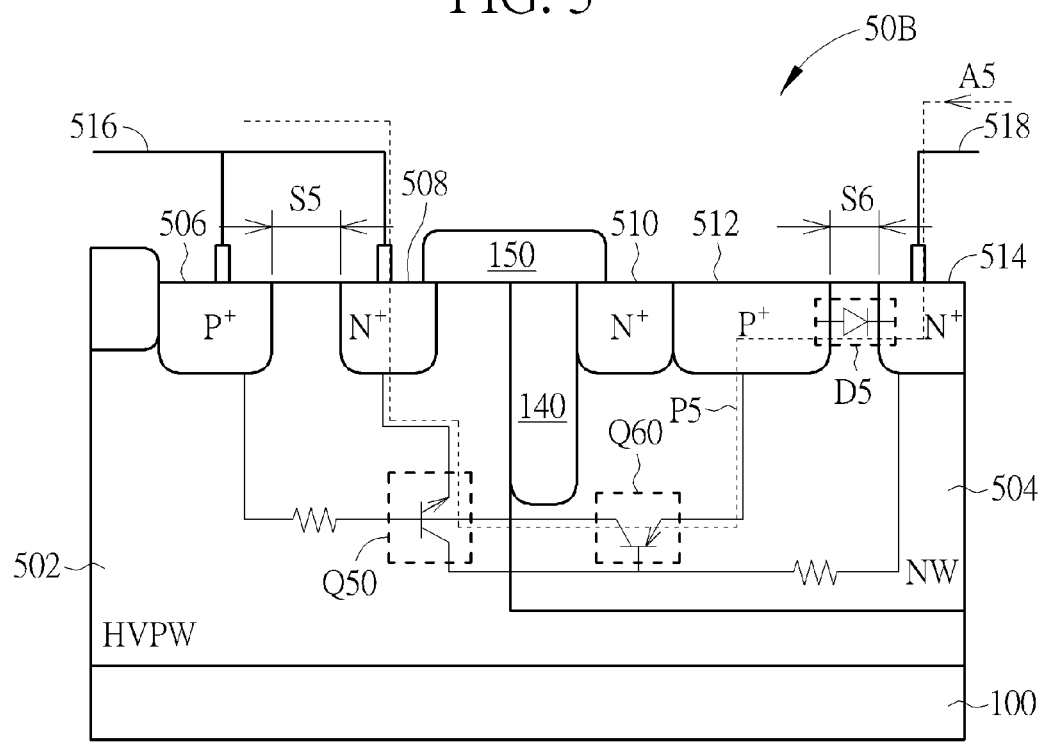
FIG. 6 shows an electrostatic discharge protection structure according to another embodiment of the present invention based on a high voltage filed-diffused SCR structure.

Furthermore, referring to FIG. 6, FIG. 6 shows an electrostatic discharge protection structure 50B according to another embodiment of the present invention based on a high voltage filed-diffused SCR structure. The electrostatic discharge protection structure 50B has no isolation structure between the first doped region 506 and the second doped region 508. Instead, the first doped region 506 and the second doped region 508 can be separated by a distance S5. The distance S5 can be between 0 μm to 2 μm.

Figure 7:
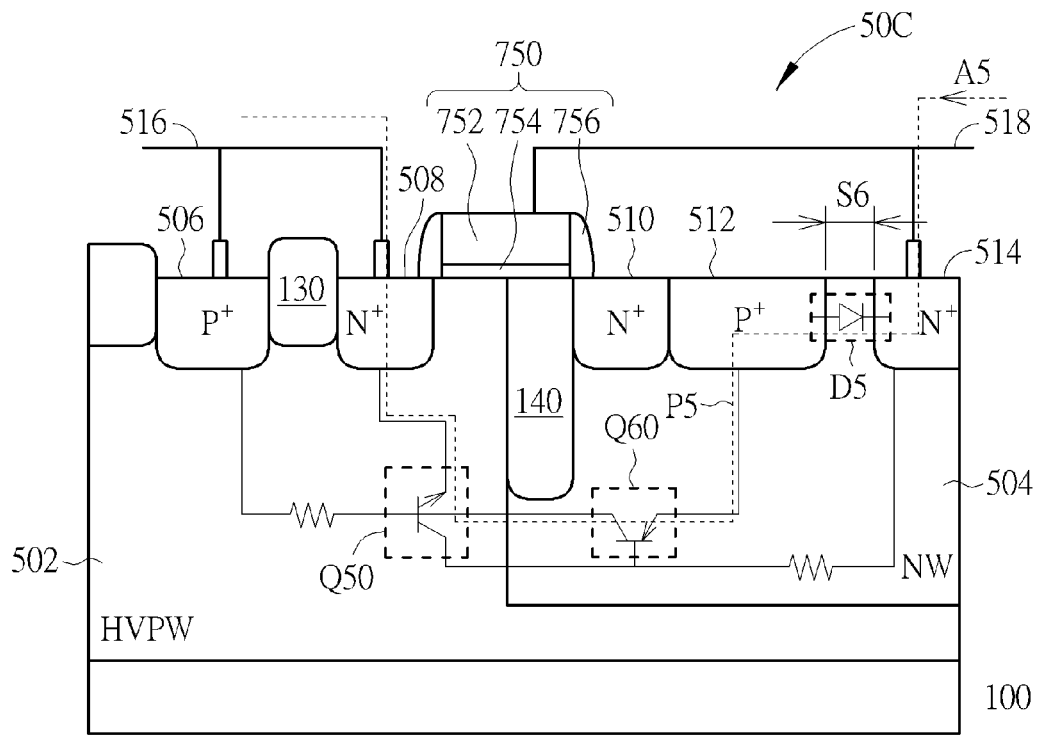
FIG. 7 shows an electrostatic discharge protection structure according to another embodiment of the present invention based on a high voltage filed-diffused SCR structure.
Figure 8:
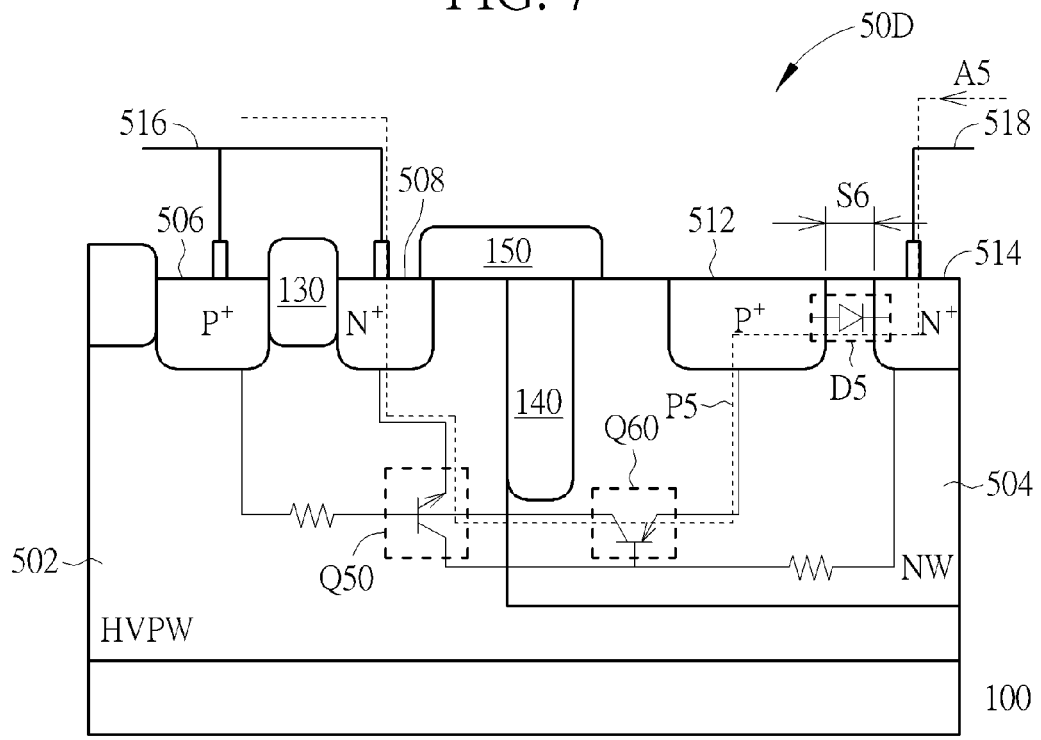
FIG. 8 shows an electrostatic discharge protection structure according to another embodiment of the present invention based on a high voltage filed-diffused SCR structure.

In addition, referring to FIG. 7, FIG. 7 shows an electrostatic discharge protection structure 50C according to another embodiment of the present invention. Instead of including an isolation structure 150, the electrostatic discharge protection structure 50C includes a gate structure 350 between the second doped region 508 and the fifth doped region 510 and connected to the second electrode 518. Also, the fifth doped region 510 is an auxiliary selection and can be removed in other embodiment. Referring to FIG. 8, FIG. 8 shows an electrostatic discharge protection structure 50D according to another embodiment of the present invention. The electrostatic discharge protection structure 50D is different from the electrostatic discharge protection structure 10A only in that the electrostatic discharge protection structure 50D has total four doped regions 506, 508, 512, and 514. Furthermore, the isolation structure 150 or the gate structure 350 can be formed between the second doped region 508 and the third doped region 512.

Similar to FIG. 1, in FIG. 5, a first bipolar junction transistor Q50 is formed by the second doped region 508, the first well 502, and the second well 504. In addition, a second bipolar junction transistor Q60 is formed by the first well 502, the second well 504 and the third doped region 512. In the embodiment of FIG. 5, a current A5 flows from the second electrode 518, the anode of the electrostatic discharge protection structure 50A, to the first electrode 516, the cathode of the electrostatic discharge protection structure 50A through the fourth doped region 514, the third doped region 512, the second well 504, the first well 502, and then the second doped region 508. Consequently, the path P5 of the current A5 contains a laminated structure of N+/P+/NW/HVPW/N+, forming an SCR.

Similar to the reversed diode D1 in FIG. 1, the third doped region 512 and the fourth doped region 514 form a reversed diode D5 on the path P5. Since the second electrode 518 is not connected to the third doped region 512, the current flows into the fourth doped region 514 must go through the third doped region 512. Therefore, the discharge current has to overcome a breakdown voltage of the reversed diode D5. That is, the holding voltage $V_h$ of the electrostatic discharge protection structure 50A is increased by an amount of the breakdown voltage of the reversed diode D5, for instance, about 7-8 V.

Again, when a distance S6 between the third doped region 512 and the fourth doped region 514 increases, the breakdown voltage of the reversed diode D5 also increases. Therefore, the holding voltage $V_h$ of the electrostatic discharge protection structure 50A can be adjusted by adjusting the distance S6 between the third doped region 512 and the fourth doped region 514. The distance S6 can be between 0 μm and 5 μm.

Figure 9:
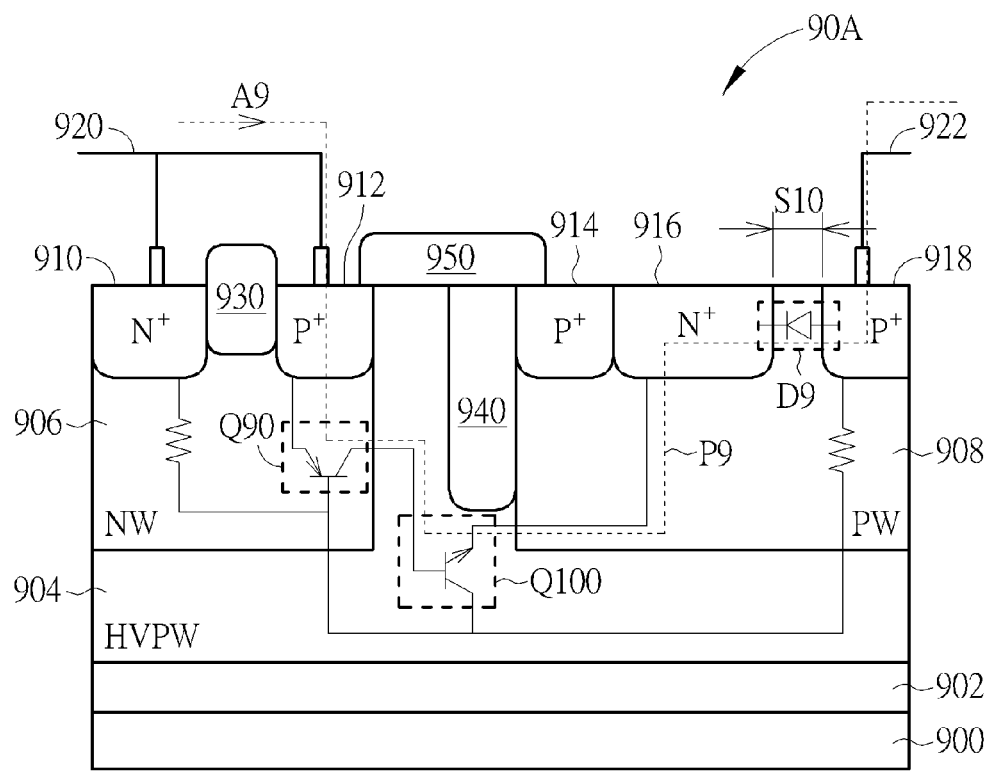
FIG. 9 shows an electrostatic discharge protection structure according to one embodiment of the present invention based on a high voltage lateral-diffused SCR structure.

Referring to FIG. 9, FIG. 9 shows an electrostatic discharge protection structure 90A according to another embodiment of the present invention based on a high voltage lateral-diffused SCR structure. The electrostatic discharge protection structure 90A is disposed on a substrate 900. The electrostatic discharge protection structure 90A includes an isolation layer 902, a first well 904, a second well 906, a third well 908, a first doped region 910, a second doped region 912, a third doped region 916, a fourth doped region 918, a fifth doped region 914, a first electrode 920, and a second electrode 922. The second doped region 912, the fourth doped region 918, and the fifth doped region 914 are P+ doped regions while the first doped region 910 and the third doped region 916 are N+ doped regions. The first well 904 is a high voltage P-well (HVPW), the second well 906 is an N-well (NW), and the third well 908 is a P-well (PW). The isolation layer 902 is disposed on the substrate 900. The first well 904 is disposed on the isolation layer 902. The second well 906 and the third well 908 are disposed in the first well 904. The first doped region 910 and the second doped region 912 are disposed in the second well 906. The third doped region 916, the fourth doped region 918 and the fifth doped region 914 are disposed in the third well 908. The third doped region 916 is disposed between the fifth doped region 914 and the fourth doped region 918.

The first well 904 has a lower doping concentration than the second well 906 and third well 908. The first to fifth doped regions 910, 912, 916, 918 and 914 have a higher doping concentration than the second well 906 and third well 908. In one embodiment, the doping concentration of the first well 904 is $10^{15}$ to $10^{17}$ cm$^{-3}$, the doping concentration of the second well 906 and third well 908 is $10^{17}$ to $10^{19}$ cm$^{-3}$, and the doping concentration of the first to fifth doped regions 910, 912, 916, 918 and 914 is $10^{19}$ to $10^{21}$ cm$^{-3}$. Furthermore, depths of the second well 906 and the third well 908 are smaller than the depth of the first well 904, and depths of the five doped region 910, 912, 916, 918 and 914 are smaller than the depths of the second well 906 and the third well 908. In one embodiment, the depth of the first well 902 is 0 μm to 10 μm, the depth of each of the second well 906 and the third well 908 is 0 μm to 3 μm, and the depth of each of the doped regions 910, 912, 916, 918, and 914 is 0 μm to 0.3 μm.

In one embodiment, the isolation layer 902 is an N-type buried layer with a doping concentration of $10^{19}$ to $10^{21}$ cm$^{-3}$ and a depth of 7 μm to 15 μm, while in another embodiment, the isolation layer 902 is a deep N-well with a doping concentration of $10^{15}$ to $10^{17}$ cm$^{-3}$ and a depth of 0 μm to 15 μm. In yet another embodiment, the isolation layer is an insulation layer. The depth and concentration of each well or doped region can be adjusted based on specific requirement and consideration. They are not limited to the above ranges.

Figure 10:
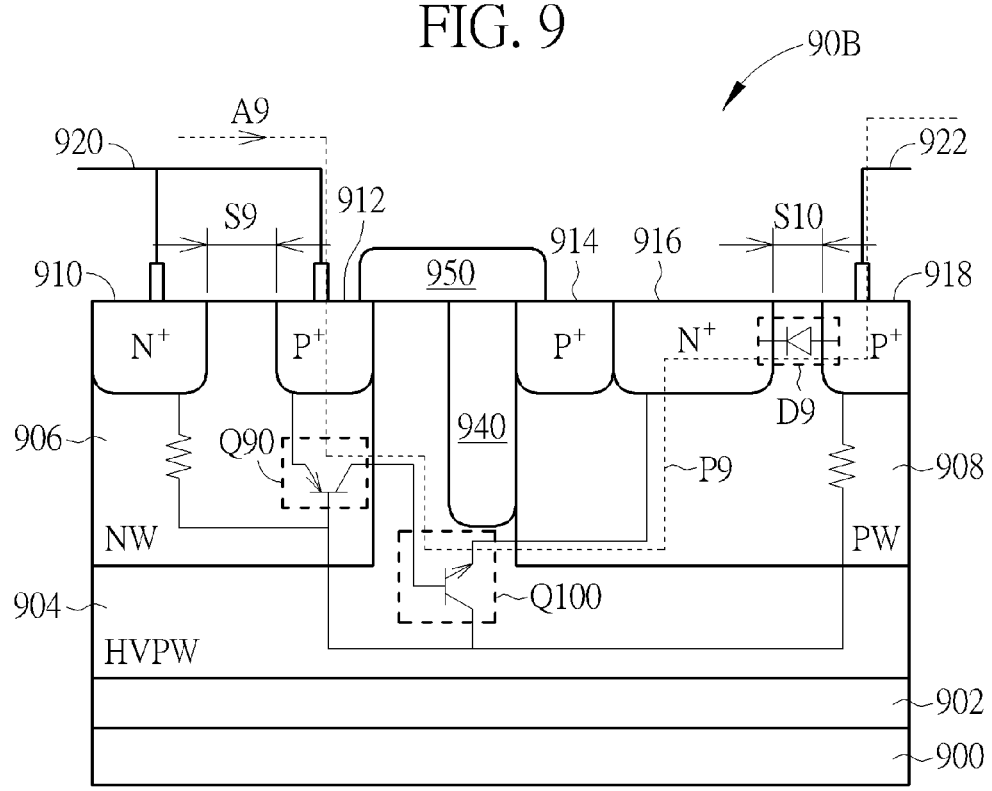
FIG. 10 shows an electrostatic discharge protection structure according to another embodiment of the present invention based on a high voltage lateral-diffused SCR structure.
Figure 11:
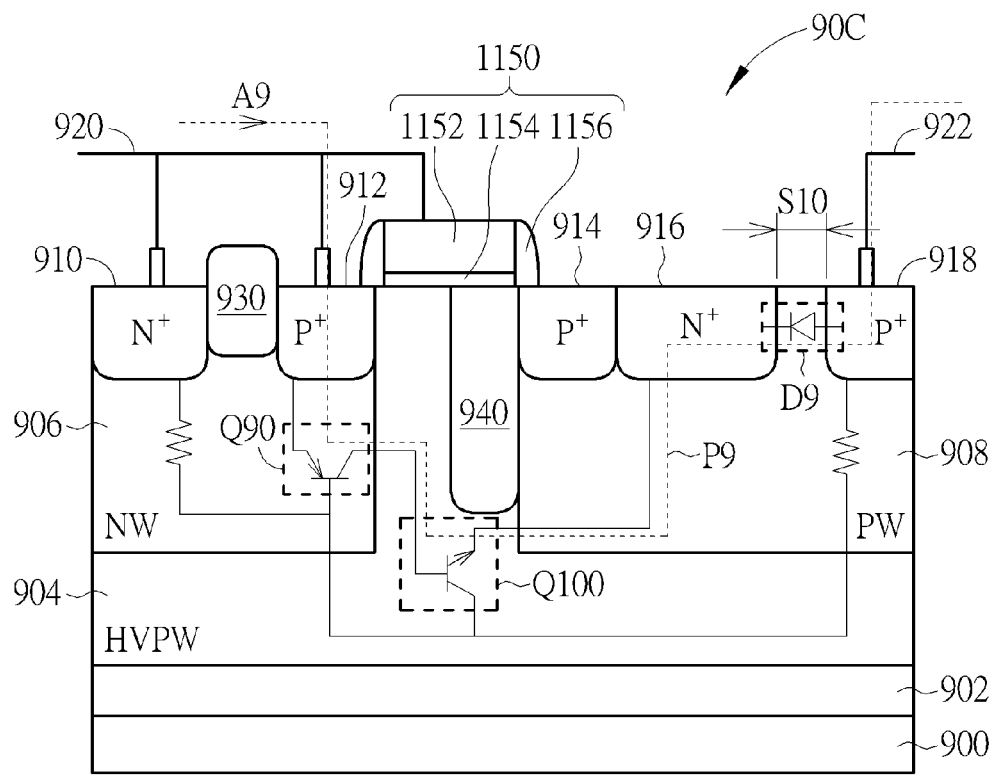
FIG. 11 shows an electrostatic discharge protection structure according to another embodiment of the present invention based on a high voltage lateral-diffused SCR structure.
Figure 12:
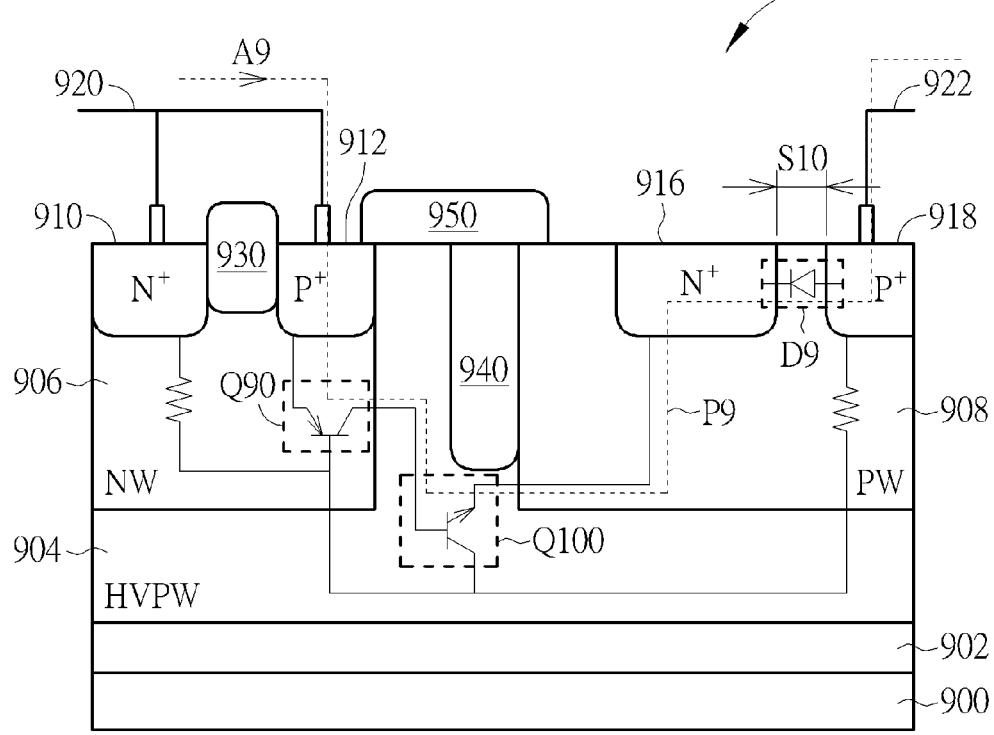
FIG. 12 shows an electrostatic discharge protection structure according to another embodiment of the present invention based on a high voltage lateral-diffused SCR structure.

The first doped region 910 and the second doped region 912 can be separated by an isolation structure 930 as shown in FIG. 9. The isolation structure 930 can be a field oxide or a shallow trench isolation structure. However, referring to FIG. 10, FIG. 10 shows an electrostatic discharge protection structure 90B according to another embodiment of the present invention based on a high voltage lateral-diffused SCR structure. The electrostatic discharge protection structure 90B has no isolation structure 930. Instead, the first doped region 910 and the second doped region 912 can be separated by a distance S9. The distance S9 can range from 0 μm to 2 μm. Referring to FIGS. 9 and 10, the second doped region 912 and the third doped region 916 can be partially blocked by an isolation structure 940. The isolation structure 940 can be a field oxide or a shallow trench isolation structure. Moreover, the electrostatic discharge protection structure 90A, 90B can further include an isolation structure 950 disposed between the second doped region 912 and the fifth doped region 914. In one embodiment, the isolation structure 550 can be a field oxide or a shallow trench isolation structure. Referring to FIG. 11, FIG. 11 shows an electrostatic discharge protection structure 90C according to another embodiment of the present invention. Instead of including an isolation structure 950, the electrostatic discharge protection structure 90C includes a gate structure 1150 between the second doped region 912 and the fifth doped region 914. The gate structure 1150 is connected to the first electrode 920 and may include a gate 1152, a gate dielectric layer 1154, and a spacer 1156. The material of the gate 1152 can be a conductor such as metal or doped polysilicon. The material of the gate dielectric layer 1154 can be an insulator such as silicon oxide or a high dielectric constant material. The material of the spacer 1156 can be an insulator such as silicon oxide. The gate structure 1150 is electrically connected to the first electrode 920. In addition, the fifth doped region 914 is an auxiliary selection and can be removed in other embodiment. Referring to FIG. 12, FIG. 12 shows an electrostatic discharge protection structure 90D according to another embodiment of the present invention. The electrostatic discharge protection structure 90D is different from the electrostatic discharge protection structure 90A only in that the electrostatic discharge protection structure 90D has total four doped regions 910, 912, 916, and 918. Furthermore, the isolation structure 950 or the gate structure 1150 can be formed between the second doped region 912 and the third doped region 914.

The first electrode 920 is the anode of the electrostatic discharge protection structure 90A to 90D and the second electrode 922 is the cathode of the electrostatic discharge protection structure 90A to 90D. The first electrode 920 is electrically connected to the first doped region 910 and the second doped region 912. The second electrode 922 is electrically connected to the fourth doped region 918. Unlike the traditional SCR electrostatic discharge protection structure, the third doped region 916 is not electrically connected to the second electrode 922.

Referring to FIG. 9, a first bipolar junction transistor Q90 is formed by the second doped region 912, the second well 906, and the first well 904. In addition, a second bipolar junction transistor Q100 is formed by the second well 906, the first well 904, the third well 908, and the third doped region 916. In the embodiment of FIG. 9, a current A9 flows from the first electrode 920 to the second electrode 922 through the second doped region 912, the second well 906, the first well 904, the third well 908, the third doped region 916, and the fourth doped region 918. Consequently, the path P9 of current A9 contains a laminated structure of $P^+/NW/HVPW/PW/N^+/P^+$, forming an SCR.

The third doped region 916 and the fourth doped region 918 form a reversed diode D9 on the path P9. Since the second electrode 922 is not connected to the third doped region 916, the current flows into the third doped region 916 must go through the fourth doped region 918 to reach the second electrode 922. Therefore, the discharge current will have to overcome a breakdown voltage of the reversed diode D9. That is, the holding voltage $V_h$ of the electrostatic discharge protection structure 90A is increased by an amount of the breakdown voltage of the reversed diode D9, for instance, about 7-8 V.

Moreover, when a distance S10 between the third doped region 916 and the fourth doped region 918 increases, the breakdown voltage of the reversed diode D9 also increases. Therefore, the holding voltage $V_h$ of the electrostatic discharge protection structure 90A can be adjusted by adjusting the distance S10 between the third doped region 916 and the fourth doped region 918. The distance S10 can range from 0 μm to 5 μm.

As described above, this invention provides electrostatic discharge protection structures that can increase the holding voltage $V_h$ to levels larger than the system supply voltage, preventing the latch-up issue caused by unexpected noise.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An electrostatic discharge protection structure, comprising:
   an isolation layer disposed on a substrate;
   a high voltage P-well disposed on the isolation layer;
   an N-well disposed in the high voltage P-well, wherein a doping concentration of the N-well is higher than a doping concentration of the high voltage P-well;
   a P-well disposed in the high voltage P-well, wherein a doping concentration of P-well is higher than the doping concentration of the high voltage P-well, and the P-well is separated from the N-well;
   a first doped region of N-type conductivity disposed in the N-well;
   a second doped region of P-type conductivity disposed in the N-well;
   a third doped region of N-type conductivity disposed in the P-well;
   a fourth doped region of P-type conductivity disposed in the P-well;
   a first electrode electrically connected to the first doped region and the second doped region; and
   a second electrode electrically connected to the fourth doped region but not directly electrically connected to the third doped region;
   wherein the third doped region and the fourth doped region form a diode with the third doped region being a cathode of the diode and the fourth doped region being an anode of the diode.

2. The electrostatic discharge protection structure of claim 1, wherein the isolation layer is a deep N-well.

3. The electrostatic discharge protection structure of claim 2, wherein a doping concentration of the deep N-well is $10^{15}$ to $10^{17}$ cm$^{-3}$ and a depth of the deep N-well is less than 15 μm.

4. The electrostatic discharge protection structure of claim 1, wherein the isolation layer is an insulation layer.

5. The electrostatic discharge protection structure of claim 1, further comprising an isolation structure disposed between the second doped region and the third doped region in the high voltage P-well or the P-well.

6. The electrostatic discharge protection structure of claim 5, wherein the isolation structure is a field oxide layer or a shallow trench isolation structure.

7. The electrostatic discharge protection structure of claim 1, further comprising a gate structure disposed between the second doped region and the third doped region.

8. The electrostatic discharge protection structure of claim 1, further comprising an isolation structure disposed between the second doped region and the third doped region above the high voltage P-well or the P-well.

9. The electrostatic discharge protection structure of claim 8, wherein the isolation structure is a field oxide layer or a shallow trench isolation structure.

10. The electrostatic discharge protection structure of claim 1, further comprising a fifth doped region of P-type conductivity disposed in the P-well, wherein the third doped region is disposed between the fourth doped region and the fifth doped region.

11. The electrostatic discharge protection structure of claim 10, wherein a doping concentration of the fifth doped regions is $10^{19}$ to $10^{21}$ cm$^{-3}$, and a depth of the fifth doped regions is less than 0.3 μm.

12. The electrostatic discharge protection structure of claim 10, further comprising an isolation structure disposed between the second doped region and the fifth doped region above the high voltage P-well or the P-well.

13. The electrostatic discharge protection structure of claim 1, further comprising a gate structure disposed between the second doped region and the fifth doped region.

14. The electrostatic discharge protection structure of claim 1, wherein a distance between the first doped region and the second doped region is less than 2 μm.

15. The electrostatic discharge protection structure of claim 1, further comprising a shallow trench isolation structure disposed between the first doped region and the second doped region.

16. The electrostatic discharge protection structure of claim 1, wherein a distance between the third doped region and the fourth doped region is less than 5 μm.

17. The electrostatic discharge protection structure of claim 1, wherein the doping concentration of the high voltage P-well is $10^{15}$ to $10^{17}$ cm$^{-3}$, a depth of the high voltage P-well is less than 10 μm, the doping concentration of each of the N-well and the P-well is $10^{17}$ to $10^{19}$ cm$^{-3}$, a depth of each of the N-well and the P-well is less than 3 μm, a doping concentration of the four doped regions is $10^{19}$ to $10^{21}$ cm$^{-3}$, and a depth of the four doped regions is less than 0.3 μm.

* * * * *